US012674836B2

(12) United States Patent　　　　(10) Patent No.:　US 12,674,836 B2

Poechmueller　　　　　　　　　　　　(45) Date of Patent:　　Jul. 7, 2026

(54) MULTIPLE TILE MOTHERBOARD TESTER

(71) Applicant: Intelligent Memory Limited, Kwai Chung (HK)

(72) Inventor: Peter Poechmueller, Jinan (CM)

(73) Assignee: Intelligent Memory Limited, Kwai Chung (HK)

( * ) Notice: Subject to any disclaimer, the term of this patent is extended or adjusted under 35 U.S.C. 154(b) by 192 days.

(21) Appl. No.: 18/371,415

(22) Filed: Sep. 21, 2023

(65) Prior Publication Data

US 2025/0102560 A1　　　Mar. 27, 2025

(51) Int. Cl.
　　　*G01R 31/28*　　　(2006.01)
(52) U.S. Cl.
　　　CPC .................................. *G01R 31/2808* (2013.01)
(58) Field of Classification Search
　　　CPC .......... G01R 31/28–2898; G01R 31/10; G01R
　　　　　　　　　　31/318577; G01R 31/26–2656; G01R
　　　　　　　　　　　　　　　　1/07321; G01R 1/07335
　　　See application file for complete search history.

(56) References Cited

U.S. PATENT DOCUMENTS

| 4,902,969 | A | * | 2/1990 | Gussman | ........... | G01R 31/2863 |
| | | | | | | 324/750.05 |
| 5,633,598 | A | * | 5/1997 | Van Loan | .......... | G01R 1/07328 |
| | | | | | | 324/755.05 |
| 6,239,592 | B1 | | 5/2001 | Carney et al. | | |
| 6,357,023 | B1 | | 3/2002 | Co et al. | | |
| 2002/0056057 | A1 | | 5/2002 | Co | | |
| 2003/0137862 | A1 | * | 7/2003 | Brunelle | ............ | G01R 31/2886 |
| | | | | | | 365/63 |
| 2005/0125712 | A1 | | 6/2005 | Co et al. | | |
| 2006/0002161 | A1 | * | 1/2006 | Dangelo | ............ | G01R 31/2879 |
| | | | | | | 363/147 |
| 2006/0242468 | A1 | | 10/2006 | Kang | | |
| 2012/0191402 | A1 | | 7/2012 | Filler et al. | | |
| 2020/0056057 | A1 | * | 2/2020 | Nagarajan | ........... | D06M 13/292 |

FOREIGN PATENT DOCUMENTS

| DE | 102005060930 A1 | 11/2006 | | |
| DE | 10126591 B4 | 1/2016 | | |
| JP | 2017022334 A | * | 1/2017 | |
| KR | 102012509 B1 | * | 8/2019 | ......... G01R 31/2863 |
| TW | 200910368 A | 3/2009 | | |

OTHER PUBLICATIONS

Machine translation of KR-102012509-B1 (Year: 2019).*
Machine Translation of JP-2017022334-A (Year: 2017).*

* cited by examiner

*Primary Examiner* — Lee E Rodak
*Assistant Examiner* — Jeremiah J Barron
(74) *Attorney, Agent, or Firm* — Fish IP Law, LLP;
Tomas A. Prieto

(57) ABSTRACT

A tester board system that includes a frame upon which a plurality of motherboards can be inserted for the purposes of BI and other types of component testing. Each motherboard has memory channels that can accommodate a plurality of memory components for testing, and the memory channels are connected to a CPU. In preferred embodiments, the CPU is on the underside of the motherboard and the memory channels on the top side of the motherboard.

12 Claims, 7 Drawing Sheets

MULTIPLE TILE MOTHERBOARD TESTER

FIELD OF THE INVENTION

The field of the invention is memory test systems.

BACKGROUND

The background description includes information that may be useful in understanding the present invention. It is not an admission that any of the information provided herein is prior art or relevant to the presently claimed invention, or that any publication specifically or implicitly referenced is prior art.

DRAM and Flash memory technologies have been well-known for many years. Over time, the basic underlying technology has remained essentially the same with interfaces changing over time, e.g., Fast Page Mode (FPM), Extended Data Out (EDO), Synchronous DRAM (SDRAM), Double Data Rate 1-4 (DDR1, DDR2, DDR3, DDR4), etc. In some applications the DRAM components are soldered onto PCB substrates to form a module, e.g. DIMM module to be plugged into motherboards of computer systems.

Testing of packaged memory components is traditionally done in several steps and multiple insertions. Typically, packaged DRAM components are first submitted to a burn-in ("BI") test. This test is performed with high parallelism in expensive BI systems. For example, current BI systems can cost US$500,000 to $1,000,000 per test system. Because of the high number of parts tested and contacted, such systems run at low frequencies of around 5-20 MHz, which is far from normal operation frequency of such semiconductors being 1 GHz. To reduce need for signaling, most approaches use internal on chip test circuitry to compress all data signal onto a single external data pin (e.g., reduce 16 DQ to a single DQ) and other test modes to modify internal voltages for more effective stress of memory components. The purpose of the BI test is to age semiconductors in several hours of stress to avoid infancy fails at the customer level. Related stress tests are typically performed at elevated voltages and temperatures up to 125 degrees Celsius. Typically, thousands of components are tested in parallel in a single BI test system.

After a successful BI test, components will be submitted to weak cell or core test. Those tests are designed to identify weak DRAM memory cells which might fail at the customer level due to poor memory cell retention or other weaknesses. Tests are performed on expensive automatic test equipment costing typically one to three million US dollars, operating at frequencies of 200-500 MHz and testing 200-1000 components in parallel. Due to the large amount of signals supplied, some signals like address/command will be shared between multiple components and chip supplier-provided test modes for data compression, such that a reduced amount of DQ need to be contacted (e.g. only 4 data signals instead of full 16 signals by data compression (read) and replication (write) methods). Such tests might be performed at different temperatures. For example, a set of components can be tested e.g. at 95 degrees Celsius, be removed from the system and at a later time on a different test system be tested at −40 degrees Celsius. Removal is needed because a test handler cannot change temperature so quickly without other adverse impact. A handler is attached to the test system for feeding DRAM components to be tested onto the test head and provide intended test temperature.

After a successful weak cell test, components will be submitted to a speed test conducted by a DRAM speed tester, as is known in the art. During this test all electrical signals of the components need to be connected to the speed tester to make sure all signals and circuitry are fully functional. A DRAM with 16 DQ will have to be connected to 16 individual DQ signals without compression modes. Therefore, parallelism of such test systems is relatively low in the range of 50-200 components. Also, parts have to be operated at full system speed in the range of 1 GHz. Therefore, such systems are very costly, typically costing from 3-5 million dollars. Tests might also be required at different temperatures, (e.g., 95 C and later again at −40 C) to guarantee customer specification of fully functional parts are met.

As mentioned above, DRAM packaged components are submitted to a set of at least 3 different test systems for BI, weak cell and speed test. Some test steps might have to be done at different temperatures requiring up to 5 times being submitted to test. This means components are handled up to 5 times or more if retest is required. This causes handling damage to contacts (e.g., the contact balls of FBGA components) which is not desirable but cannot be avoided in today's test approaches. In addition, very costly tooling is required to feed and handle DRAM components within a test handler and to connect them electrically to the test head. For example, a Hifix electrically connects the component to the tester signal channels. Such tooling is product-specific and has to be provided for each individual DRAM. A FPGA 78 package of 9×11 mm needs totally different tooling and Hifix than e.g. FBGA 96 package of 7×10 mm. A single set of tooling for one product can easily exceed US $250,000.

In view of the above, the reader can readily appreciated that existing test flows of advanced semiconductor are costly and complicated. Additionally, the nature of the testing risks damaging the components themselves. Thus, there is still a need for a simpler, safer way to test DRAM components.

SUMMARY OF THE INVENTION

The inventive subject matter provides apparatus, systems and methods in which a tester board includes a frame made of a sturdy material (for example, a metal such as aluminum, carbon composites, etc.). The frame includes at least two motherboards mounted thereon, and each motherboard includes at least one central processing unit ("CPU") and one memory channel with a module slot or memory component socket.

In embodiments of the inventive subject matter, the tester board includes up to 10 motherboards mounted on the frame. In variations of these embodiments, the amount of motherboards can be between 4 and 10, inclusive.

In embodiments of the inventive subject matter, the motherboards mounted on the tester can be identical. In other embodiments of the inventive subject matter, the motherboards do not have to be identical.

In embodiments of the inventive subject matter, the motherboards on the tester board are aligned along a single horizontal plane. In some of these embodiments, the horizontal plane is a horizontal rectangular plane. In still another variation of these embodiments, the horizontal rectangular plane has dimensions between 30 cm×30 cm and 2 m×2 m, inclusive.

In embodiments of the inventive subject matter, the at least one module slot and/or memory component socket is on a first side of a motherboard, and the at least one CPU is on a second side of the motherboard. The at least one CPU is electrically connected to the at least one module slot/memory component via a connection that can traverse the width of the motherboard to electrically couple these components.

In embodiments of the inventive subject matter, the at least one memory module slot is disposed on the motherboard such that, when a memory module is inserted into a corresponding memory module slot, memory module(s) are aligned vertically relative to the motherboard.

In embodiments of the inventive subject matter, the at least one memory component socket is disposed on the motherboard such that, when a memory component is inserted into a corresponding memory component socket the memory component(s) are aligned horizontally relative to the motherboard.

In embodiments of the inventive subject matter, the tester board system includes an electrical connector between the frame component and the at least one motherboard such that an electrical signal and/or electrical charge can be transferred between the frame and the at least one motherboard.

Various objects, features, aspects and advantages of the inventive subject matter will become more apparent from the following detailed description of preferred embodiments, along with the accompanying drawing figures in which like numerals represent like components.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The following description includes information that may be useful in understanding the present invention. It is not an admission that any of the information provided herein is prior art or relevant to the presently claimed invention, or that any publication specifically or implicitly referenced is prior art.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the"

includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

DETAILED DESCRIPTION

Throughout the following discussion, numerous references will be made regarding servers, services, interfaces, engines, modules, clients, peers, portals, platforms, or other systems formed from computing devices. It should be appreciated that the use of such terms, is deemed to represent one or more computing devices having at least one processor (e.g., ASIC, FPGA, DSP, x86, ARM, ColdFire, GPU, multicore processors, etc.) programmed to execute software instructions stored on a computer readable tangible, non-transitory medium (e.g., hard drive, solid state drive, RAM, flash, ROM, etc.). For example, a server can include one or more computers operating as a web server, database server, or other type of computer server in a manner to fulfill described roles, responsibilities, or functions. One should further appreciate the disclosed computer-based algorithms, processes, methods, or other types of instruction sets can be embodied as a computer program product comprising a non-transitory, tangible computer readable media storing the instructions that cause a processor to execute the disclosed steps. The various servers, systems, databases, or interfaces can exchange data using standardized protocols or algorithms, possibly based on HTTP, HTTPS, AES, public-private key exchanges, web service APIs, known financial transaction protocols, or other electronic information exchanging methods. Data exchanges can be conducted over a packet-switched network, the Internet, LAN, WAN, VPN, or other type of packet switched network.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Figure 1A:
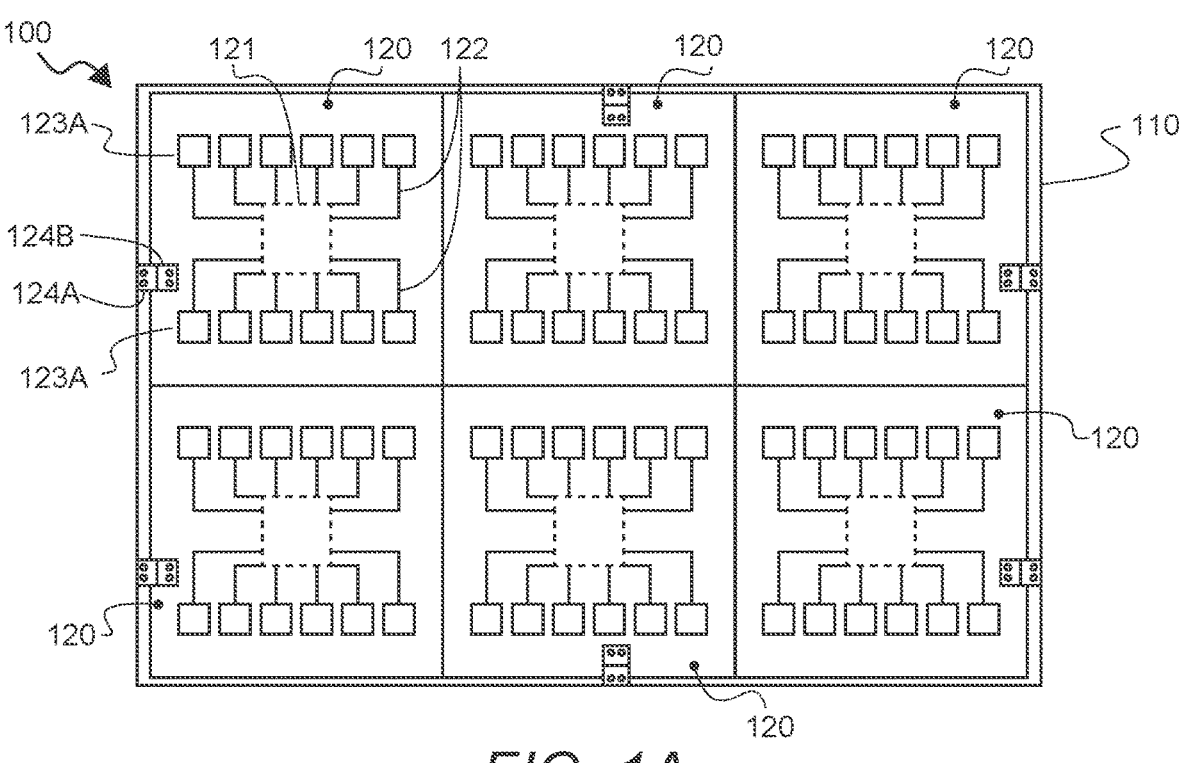
FIGS. 1A and 1B show top views of an assembled tester board system, that includes a frame and multiple motherboards disposed thereon, according to two variations of embodiments of the inventive subject matter.
Figure 1B:
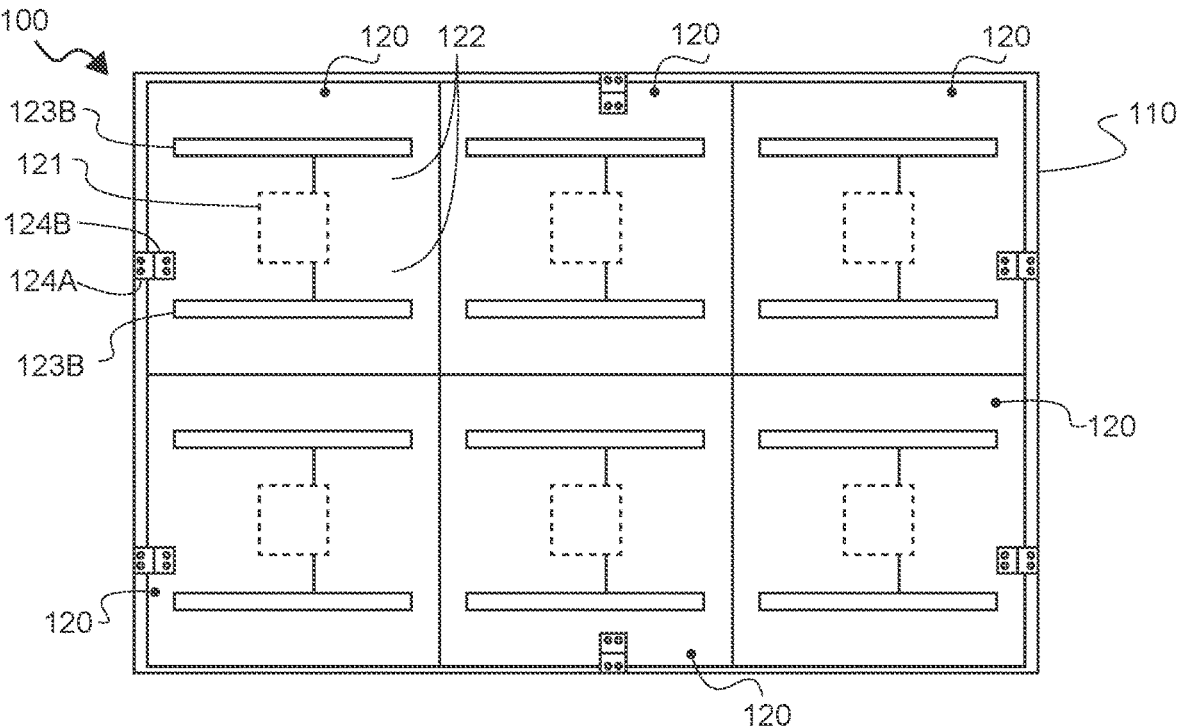

FIGS. 1A and 1B show top views (otherwise referred to as front views) of an assembled tester board system 100, that includes a frame 110 and multiple motherboards 120 disposed thereon of embodiments of the inventive subject matter. The embodiment of FIG. 1A shows memory channels 123 in the form of memory component sockets 123A configured to receive memory modules for testing. The embodiment of FIG. 1B shows memory channels 123 in the form of memory module slots 123B that receive memory modules for testing. Each of the embodiments of FIG. 1A, 1B will be discussed in greater detail below. In each of FIGS. 1A-1B, the CPU 121 that is disposed on the underside of a motherboard 120 is shown via dotted lines.

Figure 1C:
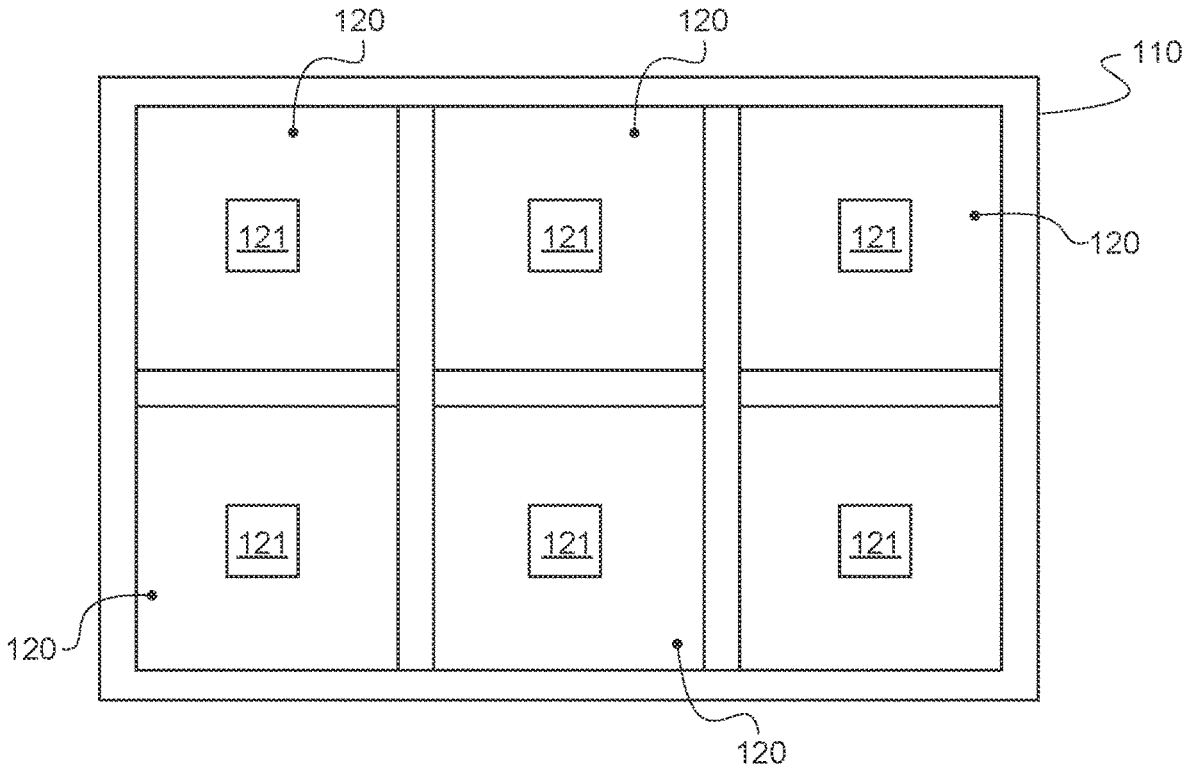
FIG. 1C shows a bottom view of the plurality of motherboards of FIG. 1A or 1B attached to the frame.

FIG. 1C shows a bottom view (also referred to as a back view) of the plurality of motherboards 120 of FIG. 1A or 1B attached to the frame 110. For the sake of clarity and simplicity in illustration, the memory channels 123 (memory component sockets 123A of FIG. 1A, memory module slots 123B of FIG. 1B) are not shown via dotted lines. The memory component sockets 123A of FIG. 1A and the memory module slots 123B of FIG. 1B can be soldered onto the motherboards 120.

The motherboards 120 are attachable to and removable from the frame 110. In preferred embodiments, the motherboards 120 can be attached to the frame 110 via plastic screws that minimize temperature transfer between the top side and bottom side of the motherboard 120. Screws of other types of materials with low heat transfer are also suitable. Other types of suitable attachment methods are also contemplated.

Without restricting the general applicability of our approach, we further describe the invention by example of DRAM (Dynamic Random Access Memory) test flow.

Figure 2:
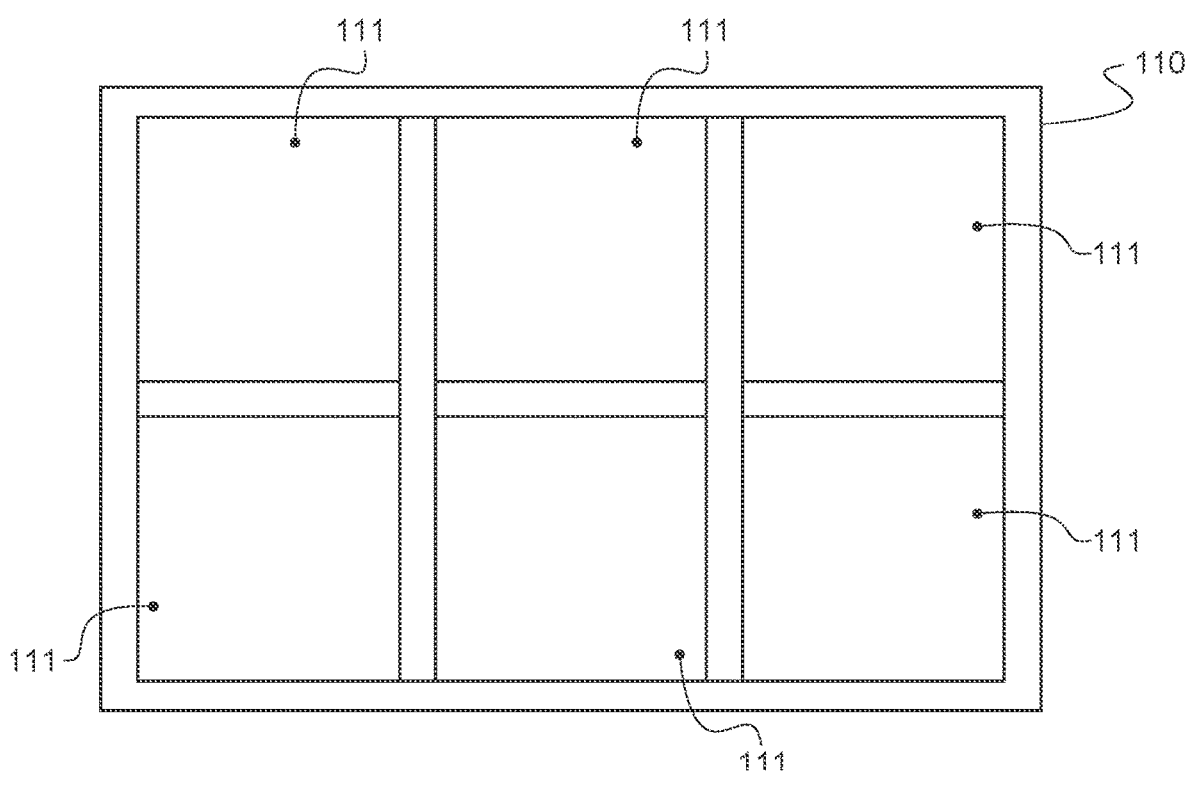
FIG. 2 provides a view of the frame in isolation.

FIG. 2 shows the frame 110 in isolation. The frame 110 is made of a sturdy material. Suitable materials can include, but are not limited to metals such as aluminum, or other materials such as carbon composites, glass fiber composites, or other stiff non-metal materials. The frame 110 includes spaces or cavities 111. When the motherboards 120 are disposed (e.g., mounted) onto the frame, the cavities 111 allow for underside access to the underside components of the motherboards 120. When the motherboards 120 are mounted onto the frame 110, components on the underside of the motherboards 120 such as the CPU 121 will stick out into the cavity 111.

The frame 110 of FIGS. 1A-2 is shown having six motherboards 120 mounted thereto, but it is contemplated that a frame 110 can have more or less motherboards 120 mounted thereto. For example, other configurations are contemplated that can fit four to ten motherboards 120.

The embodiment shown in FIGS. 1A-2 is dimensioned to be the size of a standard BI board. The reader will appreciate that the systems and methods of the inventive subject matter negate the need for existing large, expensive BI test systems. However, the use of the standard BI sizing allows for the use of other aspects of the standard BI process such as automatic loaders and unloaders that load/unload memory components. Additionally, software and analysis of socket performance can be performed in a similar manner to existing BI systems.

In the example shown in FIGS. 1A and 1B, the top of motherboards 120 align on the frame 110 such that they are touching, and the frame 110 is not visible between the boards. Aligning the motherboards 120 such that the edges touch creates a continuous surface that serves to separate and thermally isolate the top side of the boards 120 having the memory channels 123 from the underside of the boards that have the CPU 121 and other sensitive electronics components.

The frame 110 includes an electrical connector 124A that is aligned to couple with an electrical connector 124B of a motherboard 120 to provide power to the CPU 121 and other components of the motherboard 120. As seen in FIG. 1A, the frame 110 can include connectors 124A to connect with connectors 124B of all of the installed motherboards 120.

Figure 3A:
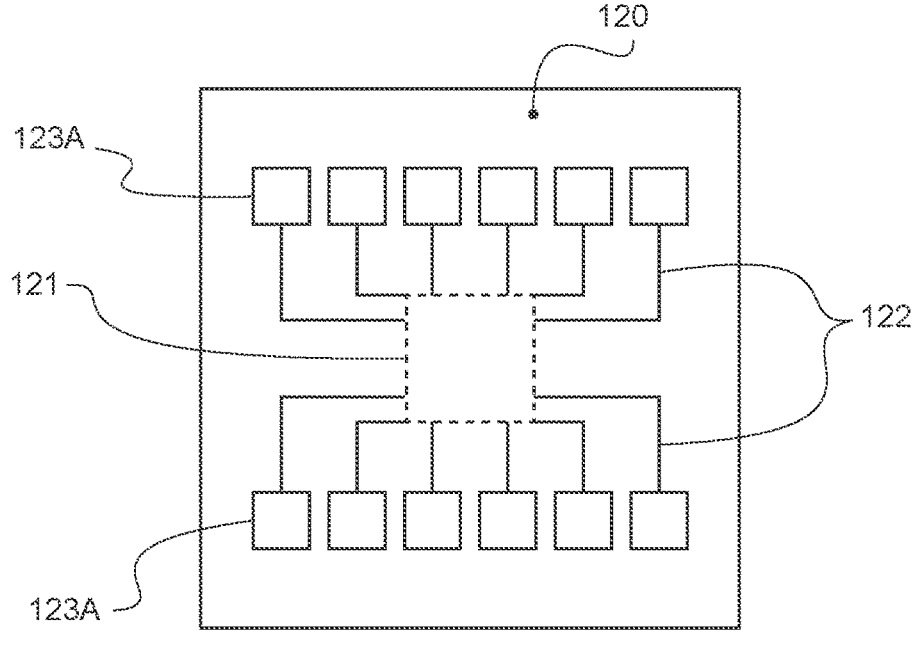
FIGS. 3A and 3B show front views in isolation of a motherboard of FIG. 1A (in FIG. 3A) and FIG. 1B (in FIG. 3B), according to embodiments of the inventive subject matter.
Figures 3B, 3C:
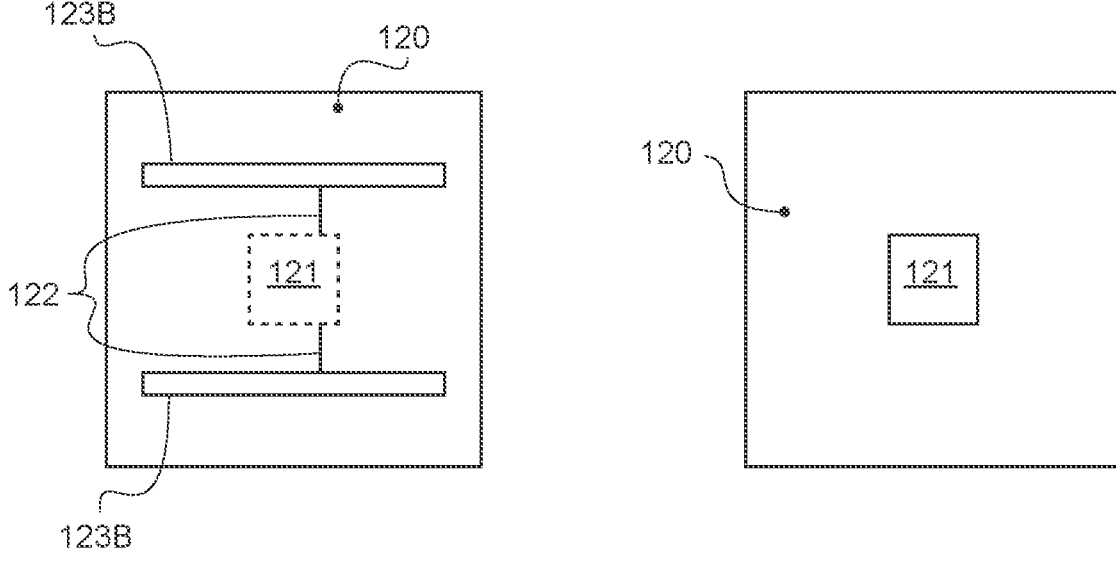
FIG. 3C provides a bottom view of the motherboard and its components, according to embodiments of the inventive subject matter.

FIGS. 3A and 3B show front views in isolation of a motherboard 120 of FIG. 1A (in FIG. 3A) and FIG. 1B (in FIG. 3B), according to embodiments of the inventive subject matter. FIG. 3C shows the back (underside) view of the motherboard 120 of FIGS. 3A, 3B.

The motherboard 120 shown in FIGS. 3A and 3B include a CPU 121 (shown in dotted lines) that is electronically connected via connections 122 to module slots 123A (in FIG. 3A) and memory component sockets 123B (in FIG. 3B). The memory component sockets 123A are configured to receive corresponding memory components for testing and the memory module slots 123B are configured to receive corresponding memory modules that in turn contain one or more memory components for testing. In FIGS. 1A-1B and 3A-3B, the CPU 121 is shown in dotted lines to illustrate that it is on the opposite side of the motherboard 120.

As seen in FIGS. 3A and 3B, the CPU 121 is disposed on a bottom side (also referred to as the back side) of the motherboard 120 via its depiction in dotted lines whereas the memory channels 123 (the memory component sockets 123A and/or the module slots 123B) are on or near the top side (also referred to as the front side) of the motherboard 120.

This arrangement enables the CPU 121 to be protected against the temperature variations provided by a micro-climate chamber when testing memory units or memory components are inserted into the memory component sockets 123A and/or the module slots 123B, respectively. For example, during testing the temperature around the CPU 121 can differ from the temperature around the memory channels 123 (and the memory module or memory component connected thereto) by at least 5 degrees Celsius.

As with FIGS. 1A-1B, in FIGS. 3A and 3B, the CPU 121 is shown via dotted lines to show that they are on the opposite side of the motherboard 120 from the memory component sockets 123A (in FIG. 3A) and the memory module slots 123B (in FIG. 3B). These memory channels 123 are not shown in FIG. 3C via dotted lines so as to keep the figure clear.

In embodiments of the inventive subject matter, the motherboard 120 also includes wireless communication components including a wireless antenna that is communicatively coupled with the CPU 121 and that enables the CPU 121 to send and receive data to and from an external computing device. The wireless antenna can be integral to the CPU 121, such as in the embodiments shown here, or can be a separate antenna component. In order to protect the antenna and other communications components from the temperatures endured in the testing environment, the antenna and other communications components (when separate from the CPU 121) are also located on the lower side of the motherboard 120, opposite the memory channels 123. Examples of contemplated wireless data transmission modalities includes WiFi, Bluetooth, NFC, etc. In embodiments of the inventive subject matter, some or all of the communications functions and/or command functions can be handled by a separate board such as a Raspberry Pi board that can issue commands to the components on the motherboard 120.

Figure 3D:
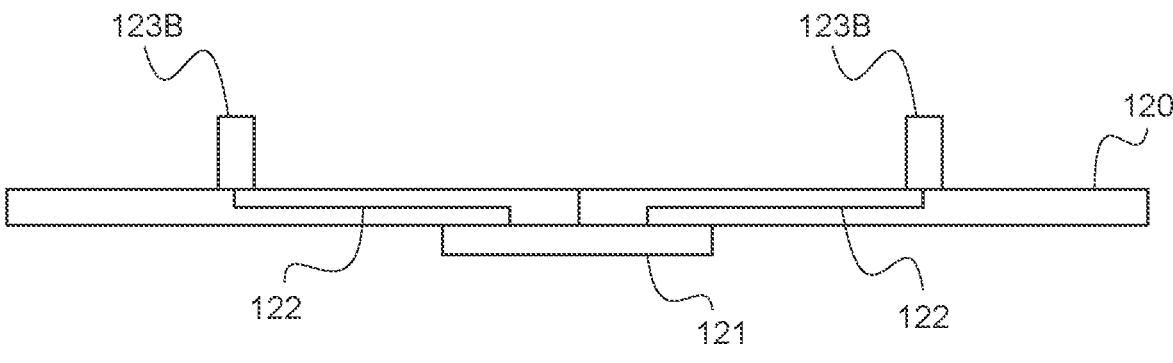
FIG. 3D shows a cross-section view of the motherboard according to the embodiments of FIG. 3B.

FIG. 3D shows a cross-section of the motherboard 120 that illustrates the connectors 122 traversing the width of the motherboard 120 to connect the CPU 121 on the underside of the board with the memory channels 123 (in this example, the module slots 123B) the of the top side of the motherboard 120. While only the embodiment shown in FIG. 3D only shows module slots 123B, the embodiment having the memory component sockets 123A would be the same with the difference being the component sockets 123A in the place of the module slots 123B.

In each of the embodiments shown in FIGS. 1A-1B, the motherboards 120 attached to each frame 110 are all shown to be identical. In other embodiments the motherboards 120 can be different to accommodate different number of memory units to be tested, or to allow for the simultaneous testing of different types of memory units.

The tester board system 100 of FIGS. 1A-1C show the motherboards 120 arranged along a single horizontal plane. In these embodiments, the tester board system 100 (having the motherboards 120) has dimensions of between 30 cm×30 cm and 2 m×2 m (including the frame 110). In preferred embodiments, the dimensions are 40 cm×60 cm, including the frame.

Figure 4A:
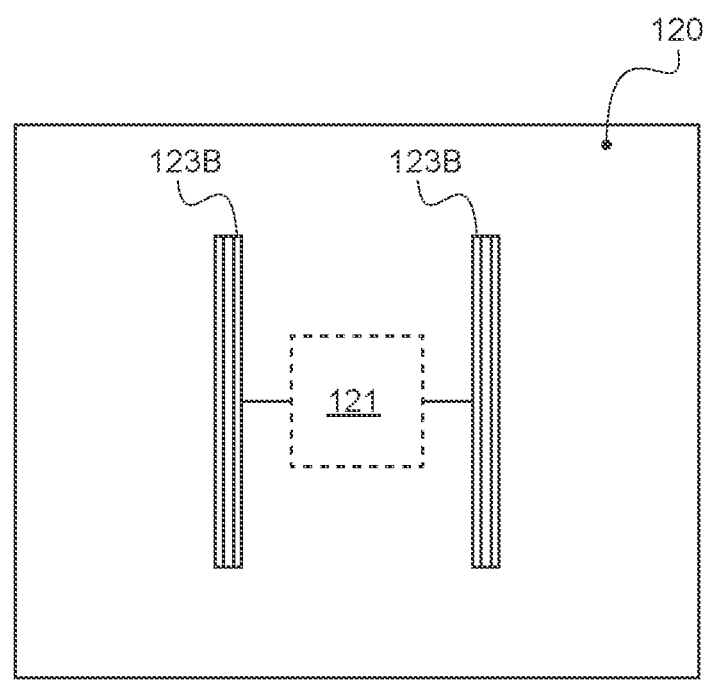
FIGS. 4A-4B show front and perspective views, respectively, of a motherboard according to another embodiment of the inventive subject matter.
Figure 4B:
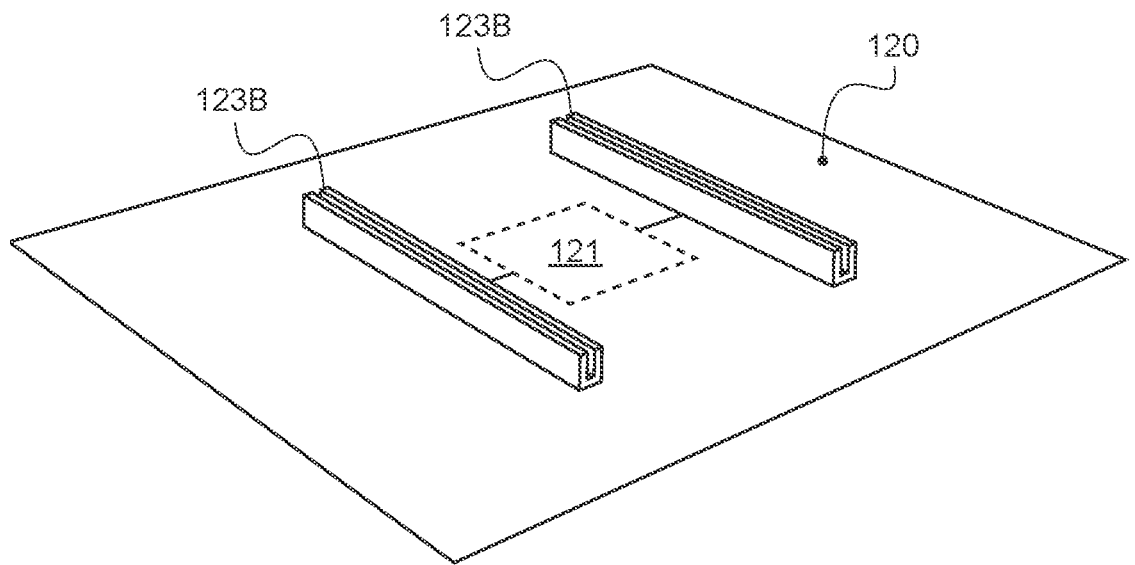

FIGS. 4A-4B show top and perspective views, respectively, of an embodiment of the inventive subject matter whereby the memory channels 123 (module slots 123B, in this example) are disposed such that when a memory module is inserted, it is vertically aligned with the motherboard 120 (e.g., it is oriented perpendicular to the motherboard 120).

Figure 5A:
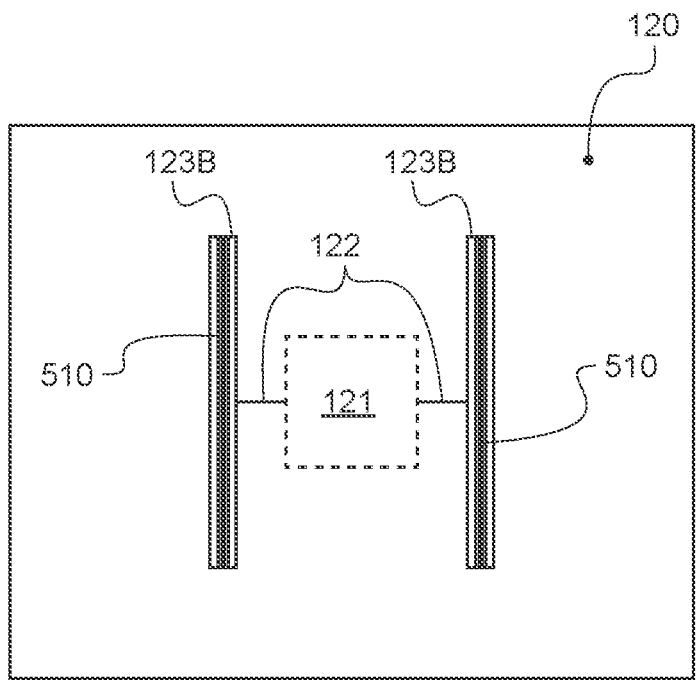
FIGS. 5A-5B show the embodiments of FIGS. 4A-4B, respectively, with a memory module inserted into the memory module slot.
Figure 5B:
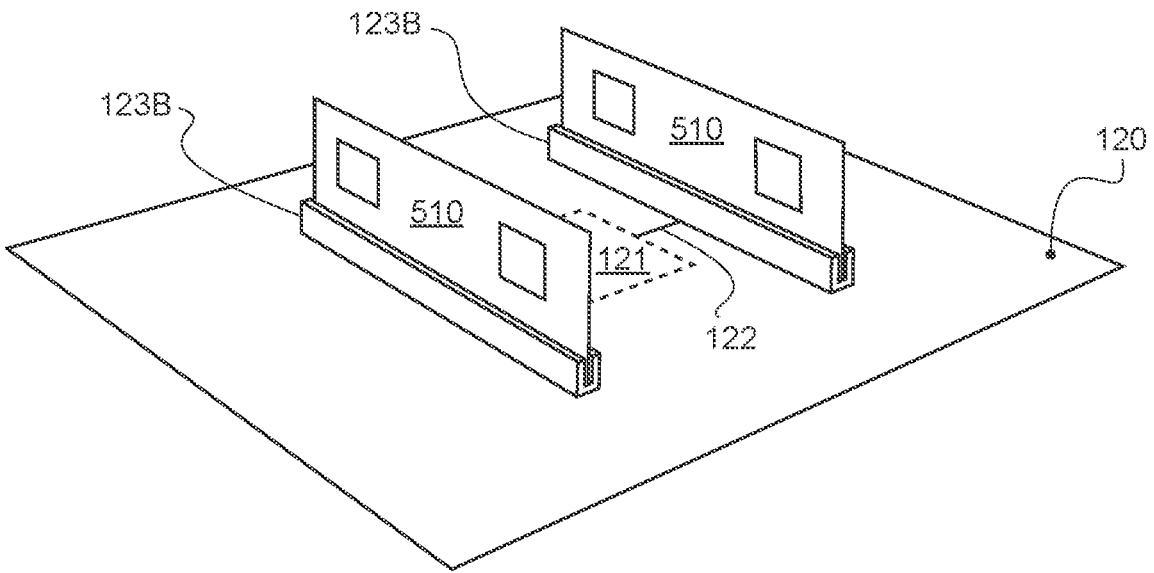

FIGS. 5A-5B show the embodiment of FIGS. 4A-4B with memory modules 510 inserted into the module slots 123B. As can be seen in FIGS. 4A-4B, the memory modules 510 extend vertically (e.g., not more than 15 degrees off-vertical) from the motherboard 120. Each module 510 can include one or more memory component socket that can receive a memory component for testing (represented by the squares on each module 510 visible in FIG. 5B).

Figure 6:
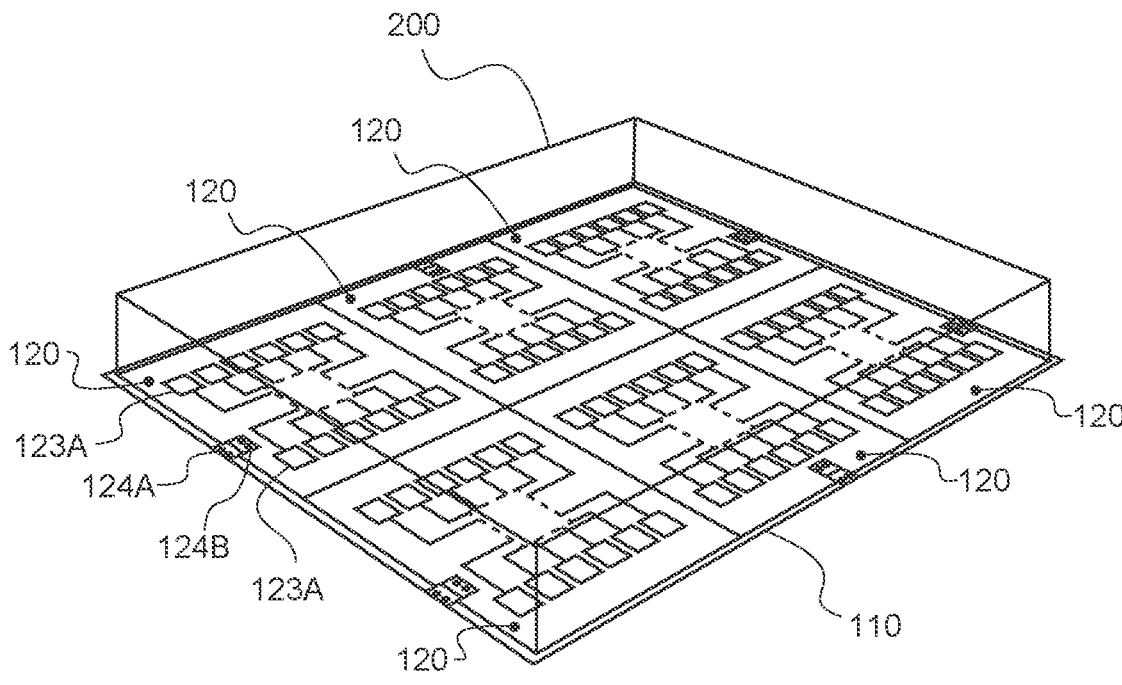
FIG. 6 shows an assembled tester system with a microclimate chamber disposed on the top side.

FIG. 6 illustrates the system 100 of FIG. 1A with a microclimate chamber 200 disposed on the upper or top side of the assembled system 100. The microclimate chamber 200 can provide a heated and/or cooled environment to test memory components attached to the motherboards 120. The microclimate chamber 200 can have a heat source and/or a cooling source (not pictured for clarity) that provides a heated environment and/or a cooled environment for component testing.

As noted above, the edges of motherboards 120 touch each other when attached to the frame 110, creating a continuous or nearly-continuous surface without gaps in between the motherboards 120. This helps to isolate the underside of the motherboards 120 from the climates produced by the microclimate chamber 200.

In the embodiment shown, the microclimate chamber 200 is dimensioned to fit over all of the motherboards 120 attached to the frame 110. In other embodiments, it is contemplated that the microclimate chamber 200 can be smaller, such that it fits over some of but not all of the motherboards 120. The astute reader will readily recognize that the microclimate chamber 200 negates the need to use large traditional, expensive BI testing equipment.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A tester board system, comprising:

at least two motherboards;

a frame dimensioned to receive the at least two motherboards, the frame including corresponding at least two cavities that receive the at least two motherboards; and each of the at least two motherboards comprising at least one memory channel on a first side and at least one CPU on a second side, wherein the at least one memory channel is communicatively coupled with the at least one CPU;

wherein the at least two motherboards are aligned along a horizontal plane when installed on the frame; and wherein the at least two motherboards are aligned when installed on the frame such that a lateral edge of a first motherboard contacts a lateral edge of a second motherboard such that the contact between the lateral edge of the first motherboard and the lateral edge of the second motherboard creates at least one of a continuous surface or a near-continuous surface without gaps between the first motherboard and the second motherboard, such that an underside of the first motherboard and underside of the second motherboard is thermally isolated from an upper side of the first motherboard and second motherboard when heat is applied to the upper side of the first motherboard and second motherboard.

2. The tester board system of claim 1, wherein the frame is made of a metal or a carbon composite.

3. The tester board system of claim 2, wherein the metal comprises aluminum.

4. The tester board system of claim 1, wherein the frame is dimensioned to receive between four and ten motherboards.

5. The tester board system of claim 4, wherein the motherboards are identical.

6. The tester board system of claim 1, wherein the horizontal plane comprises a size of between 30 cm×30 cm and 2 m×2 m.

7. The tester board system of claim 1, wherein the frame further comprises an electrical connector configured to couple with a corresponding electrical connector of the at least two motherboards.

8. The tester board system of claim 7, wherein the electrical connector comprises at least two electrical connectors, each of the at least two electrical connectors configured to couple with a corresponding electrical connector of each of the at least two motherboards.

9. The tester board system of claim 1, wherein each of the at least one memory channel comprises a memory module slot configured to receive a memory module or a memory component slot configured to receive a memory component.

10. The tester board system of claim 9, wherein the memory module slot or the memory component slot are arranged on the motherboard such that an inserted memory module or memory component is aligned horizontally with the motherboard.

11. The tester board system of claim 1, further comprising a microclimate chamber dimensioned to be positioned over at least a portion of the frame, such that when the at least two motherboards are installed on the frame, the microclimate chamber covers the at least one of the continuous surface or the near-continuous surface without gaps on the first side of each of the at least two motherboards.

12. The tester board system of claim 11, wherein the microclimate chamber is dimensioned to cover the entirety of the at least one of the continuous surface or the near-continuous surface without gaps.

* * * * *